(12) United States Patent
Huber (10) Patent No.: US 8,526,247 B2
(45) Date of Patent: Sep. 3, 2013

(54) MEMORIES AND METHODS FOR SHARING A SIGNAL NODE FOR THE RECEIPT AND PROVISION OF NON-DATA SIGNALS

(75) Inventor: Brian Huber, Allen, TX (US)

(73) Assignee: Mircon Technology, Inc., Boise, ID (US)

( * ) Notice: Subject to any disclaimer, the term of this patent is extended or adjusted under 35 U.S.C. 154(b) by 158 days.

(21) Appl. No.: 12/874,938

(22) Filed: Sep. 2, 2010

(65) Prior Publication Data

US 2012/0057418 A1    Mar. 8, 2012

(51) Int. Cl.
*G11C 7/00* (2006.01)
(52) U.S. Cl.
USPC ............ 365/193; 365/189.011; 365/189.15; 365/189.16; 365/189.19; 365/189.05; 365/190; 365/191
(58) Field of Classification Search
USPC .......... 365/189.011, 189.15, 189.16, 189.19, 365/189.05, 190, 191, 193
See application file for complete search history.

(56) References Cited

U.S. PATENT DOCUMENTS

| | | | |
|---|---|---|---|
| 7,990,781 B1 * | 8/2011 | Venkataraman et al. | 365/193 |
| 8,009,504 B2 | 8/2011 | Ha et al. | |
| 8,300,464 B2 * | 10/2012 | Welker et al. | 365/185.09 |
| 2002/0034119 A1 | 3/2002 | Lee et al. | |
| 2007/0028027 A1 * | 2/2007 | Janzen et al. | 711/5 |
| 2008/0307147 A1 * | 12/2008 | Biran et al. | 710/310 |
| 2009/0113133 A1 | 4/2009 | Kim | |
| 2009/0161447 A1 * | 6/2009 | Ha et al. | 365/189.05 |
| 2011/0249522 A1 * | 10/2011 | Welker et al. | 365/194 |

OTHER PUBLICATIONS

International Search Report and Written Opinion dated Jan. 2, 2012 for PCT/US2011/047430.

* cited by examiner

*Primary Examiner* — Fernando Hidalgo
(74) *Attorney, Agent, or Firm* — Dorsey & Whitney LLP (57) ABSTRACT

Memories and methods for providing and receiving non-data signals at a signal node are disclosed. One such memory includes first and second signal nodes, and first and second signal buffer. The first signal buffer is configured to be operative responsive to a first data strobe signal and further configured to be operative responsive to a non-data signal. The second signal buffer is configured to be operative responsive to a second data strobe signal. An example first data strobe signal is a read data strobe signal provided by the memory. In another example, the first data strobe signal is a write data strobe signal received by the memory. Examples of non-data signals include a data mask signal, data valid signal, error correction signal, as well as other signals.

19 Claims, 5 Drawing Sheets

MEMORIES AND METHODS FOR SHARING A SIGNAL NODE FOR THE RECEIPT AND PROVISION OF NON-DATA SIGNALS

TECHNICAL FIELD

Embodiments of the present invention relate generally to memory, and more specifically, in one or more of the illustrated embodiments, to combining receipt and provision of non-data signals at a shared signal node.

BACKGROUND OF THE INVENTION

Data strobe signals are signals that are provided from a memory or provided to the memory when read data is output and write data is received by the memory, respectively. Data strobe signals are related to read and write data, but are not themselves data signals. For example, a read data strobe signal is provided by the memory and typically has signal transitions between a high and low levels that are coincident with the signal transitions between bits of read data output by the memory. A write data strobe signal is provided to the memory and typically has signal transitions that are coincident with "data eyes" of the bits of write data received by the memory. The write data strobe signal may be used by the memory to time the latching of the write data. Both read data and write data strobe signals typically include preamble and post amble portions that frame a strobe portion of the data strobe signals. The preamble portion may be used to establish a stable strobe condition just prior to use (either by the memory in the case of write data or a requesting entity in the case of read data) for example, at a rising edge of a next clock cycle. The post amble portions signal may be used to provide a clean strobe completion, for example, a low time after a falling edge used for data capture.

Read and write data strobe signals are typically provided from and received at a shared signal node. That is, the read data strobe is provided from a signal node during the output of data by the memory and the write data strobe is provided to the same signal node during receipt of write data by the memory. In situations where read and write operations occur immediately in sequence, a buffer coupled to the shared signal node must be allowed to conclude provision of, for example, the read data strobe and then prepare to receive, for example, the write data strobe without missing the beginning of the write strobe. In order to provide sufficient "turn around" time for the buffer, at least one clock period is typically inserted between the end of one data strobe signal and the beginning of the other data strobe signal. During the turn around time, no data can be provided or received by the memory. As a result, data bandwidth of the memory is negatively affected.

In addition to data strobe signals, other signals that are not data signals and that are not data strobe signals, but are related to read or write data may be received or provided by the memory. For example, a data mask DM signal may be provided to a memory receiving write data and used to mask portions of the write data written to memory. Another example is a output data valid QV signal which may be provided by the memory with the output of read data to indicate that the read data is valid and can be latched by a receiving entity. As known, there are other examples of non-data signals related to data as well.

Although not all examples of non-data signals are used in every memory application, memory designers often design a memory to include the functionality in order to provide flexibility in the use of the memory for various types of memory systems. As a result, the memory includes additional signal nodes to and from which non-data signals may be provided, thereby increasing the "pin count" for memories. Increasing memory pin count may be undesirable due to size constraints and board layout complexity resulting from the signal nodes, among other reasons. As the number of memory signals continues to increase, the difficulties associated with increasing memory pin count may increase as well.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
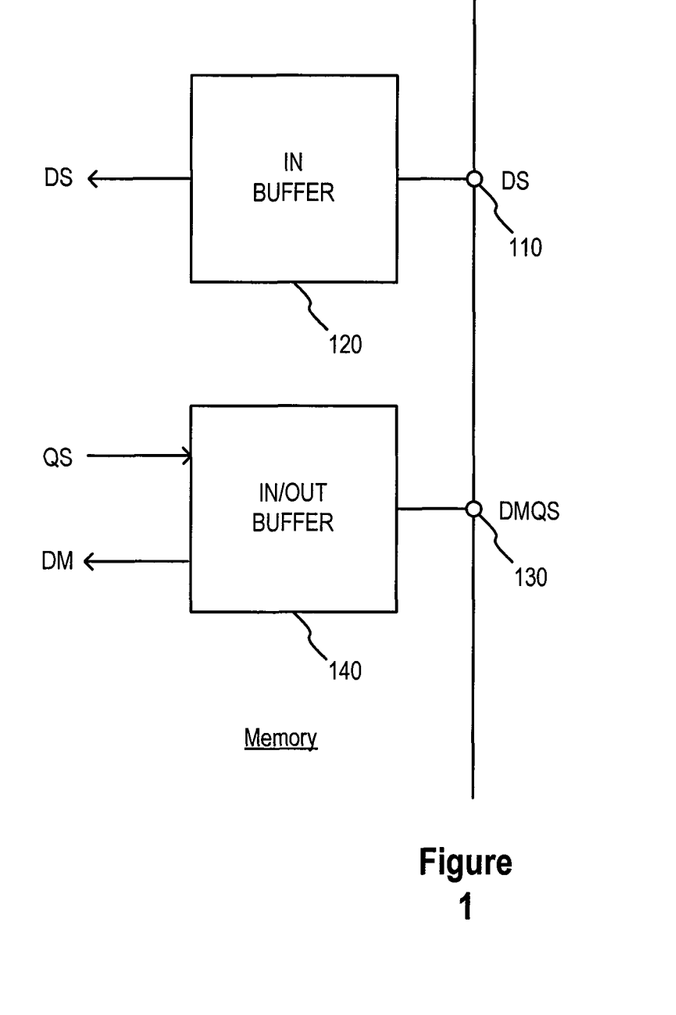
FIG. 1 is a block diagram of a portion of input and output signal nodes for a memory according to an embodiment of the invention.

FIG. 1 illustrates a portion of input and output signal nodes for a memory according to an embodiment of the invention. The portion shown in FIG. 1 are related to write data strobe signals and read data strobe signals, which as previously discussed, are both examples of non-data signals that are related to data signals. As known, a write data strobe signal is received by the memory and may be used to time the latching of write data by the memory and a read data strobe signal may be provided by the memory and may be used by the requesting entity to time reception of the read data. In contrast to conventional memory having a shared write and read data strobe node, or separate, dedicated write data strobe signal node and read data strobe signal node, FIG. 1 illustrates an embodiment of the invention in which at least one of the data strobe signals shares a node and circuitry with a non-data signal.

For example, as shown in FIG. 1, a write data strobe signal DS is provided to a signal node 110 to which an input buffer 120 is coupled to receive and buffer a DS signal. The input buffer 120 provides an internal DS signal in response. An input/output buffer 140 is coupled to a signal node 130 to which a data mask signal DM is applied and from which a read data strobe QS is provided. In operation, a DM signal applied to the signal node 130 is buffered and output internally by the input/output buffer 140. An internal QS signal is buffered and output externally on the signal node 130 by the input/output buffer 140. In some embodiments, the DS signal and the QS signal may include a "preamble" portion and may further include a "postamble" portion. A preamble is a portion of the data strobe signals that precedes the strobe portion of the DS and QS signals and a postamble is a portion of the data strobe signals that follows the strobe portion of the DS and QS signals. The DM signal is an example of a signal that typically does not have a preamble or postamble.

Figure 2:
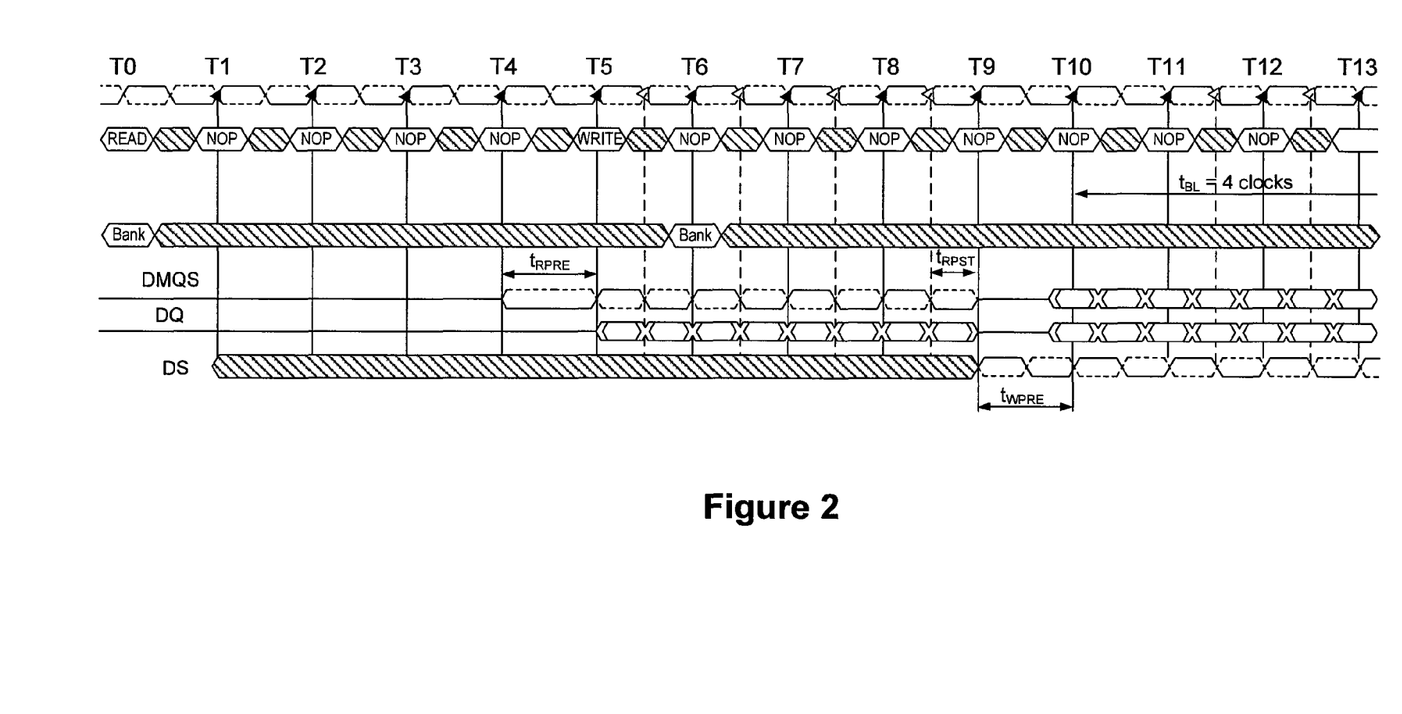
FIG. 2 is a timing diagram for various signals during operation of the embodiment of FIG. 1.

FIG. 2 illustrates a timing diagram for various signals during an example operation of a memory that includes an embodiment of the invention. For example, the timing diagram may apply to the embodiment illustrated in FIG. 1, that is, a DS signal applied to signal node 110 and a combined data mask DM signal (provided to the signal node 130) and a QS signal (provided from the signal node 130). The combined signal of signal node 130 will be referred to as the DMQS signal. The example operation of FIG. 2 includes a read operation followed by a write operation. Shown in FIG. 2, among other signals, are the write data strobe signal DS, the data mask and read data strobe signal DMQS, and read and write data signals DQ.

At time T0 a read command is issued to the memory. After about four clock cycles of read latency, a QS signal preamble is issued (from the DMQS signal node, e.g., signal node 130 of FIG. 1) at time T4 to stabilize the strobe prior to use on the next clock cycle, that is, at time T5. At time T5 the QS signal clocks in synchronicity with the read data signals DQ. In the example operation illustrated by FIG. 2, eight bits of read data are provided over four clock cycles. Also at time T5 a write command is issued to the memory to follow the output of read data. The eighth bit of read data is output during the last half-clock cycle preceding time T9. Coincident with the eighth bit is a postamble portion for the QS signal cleanly terminating the last transition of the QS signal.

At time T9 a DS signal preamble is received (at the DS signal node, e.g., signal node 110 of FIG. 1) to stabilize the strobe prior to use on the next clock cycle, that is, at time T10. The write data signals DQ are provided to the memory at a time relative to the DS signal (e.g., center of the "data eye" coincident with a clock edge of the DS signal) so that the DS signal may be used to latch the write data signals DQ. In the example operation of FIG. 1, valid write data signals can be latched beginning at time T10. Eight bits of write data are provided to the memory over four clock cycles T10 through T13. Also provided to the memory is a DM signal at the DMQS signal node, e.g., signal node 130 of FIG. 1). A mask bit is provided coincident with each bit of write data over clock cycles T10 through T13. The DM signal may be received at the same node (e.g., signal node 130, FIG. 1) from which the QS signal was provided during the read operation responsive to the read command at time T0.

As illustrated by the example operation of FIG. 2, the QS and DS signals are provided from and received at respective signal nodes, one of which, namely the read strobe signal, is shared with a signal that is not active during a respective operation. In the example operation, the signal node shared with the read strobe signal is the data mask DM signal, which is typically provided to the memory during a write operation. As previously mentioned, the DM signal which typically does not include a preamble or postamble portion can be provided to the memory at the signal node from which the QS signal was provided at a next clock cycle of the memory clock. Separating the signal nodes for the QS and DS signals may eliminate a need to include turn-around time between a last clock cycle of one of the data strobe signals and a first clock cycle of the other data strobe signal to ensure signal integrity of the data strobe signals. As illustrated in FIG. 2, for example, the DS signal begins at the time the QS signal ends at time T9. Because the QS signal is provided from a first signal node and the DS signal is provided to a second signal node, the DS signal will not affect the integrity of the QS signal. Sharing a signal node between a strobe signal and another signal that is not active during the time the data strobe signal is active may reduce the number of signal nodes required for operation of the memory. The non-data signal has a direction relative to the memory opposite of the data strobe signal. Although the particular embodiment of FIG. 1 illustrates combining the QS signal with a non-data signal (i.e., data mask DM), in some embodiments of the invention, the DS signal is combined with a non-data signal. That is, a signal having pre- and/or postamble portions is combined at a signal node with a non-data signal.

Figure 3:
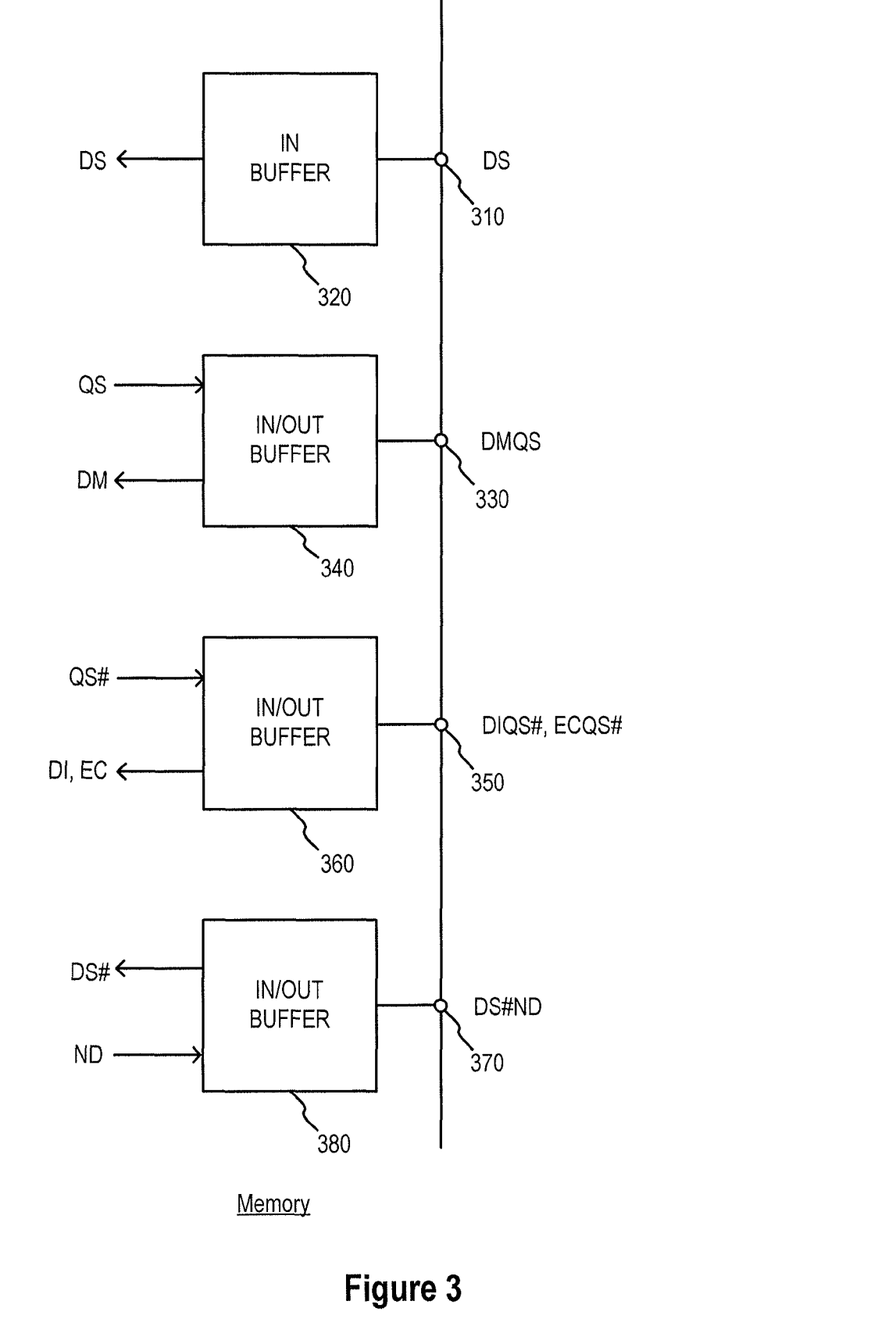
FIG. 3 is a block diagram of a portion of input and output signal nodes for a memory according to an embodiment of the invention.

FIG. 3 illustrates a portion of input and output signal nodes for a memory according to an embodiment of the invention. In contrast to conventional memory having a shared write and read data strobe node, or separate, dedicated write data strobe signal node and read data strobe signal node, FIG. 3 illustrates an embodiment of the invention in which differential signals are utilized and at least one of the data strobe signals shares a node and circuitry with a non-data signal. For example, as shown in FIG. 3, an input/output buffer 340 is coupled to a signal node 330 to which a DM signal is applied and from which a QS signal is provided. A DM signal applied to the signal node 330 is buffered and output internally by the input/output buffer 340. An internal QS signal is buffered and output externally on the signal node 330 by the input/output buffer 340. A write data strobe signal DS is provided to a signal node 310 to which an input buffer 320 is coupled to receive and buffer a DS signal. Further illustrated in FIG. 3 is an input/output buffer 380 coupled to a signal node 370 to which a complementary write data strobe signal DS# is applied to buffer and provide internally the DS# signal. The input/output buffer 380 further receives an internal non-data signal ND, which is buffered and provided to the signal node 370. An input/output buffer 360 coupled to a signal node 350 to which a data inversion signal (DI) or error correction signal (EC) is applied. An internal complementary QS# signal is buffered and output externally on the signal node 350 by the input/output buffer 360.

Although the DI, EC signals may not be present in all implementations, FIG. 3 illustrates an embodiment where differential data strobe signals are utilized and at least one of the data strobe signals is combined with a non-data signal that is not used during the operation that the respective strobe signal is used. The signal that is combined with the data strobe signal may also not include a preamble and/or postamble portion but may allow overall turnaround time reduction over combining QS and DS. The signal that is combined with the data strobe signal has a direction relative to the memory that is the opposite that of the data strobe signal. Operation of the embodiment illustrated in FIG. 3 is similar to the operation of the embodiments illustrated in FIG. 1, with the additional operation of the input/output buffers associated with the complementary data strobe signals. Although not specifically described herein, operation of the embodiment illustrated in FIG. 3 would be understood by those ordinarily skilled in the art based on the description previously provided.

Figure 4:
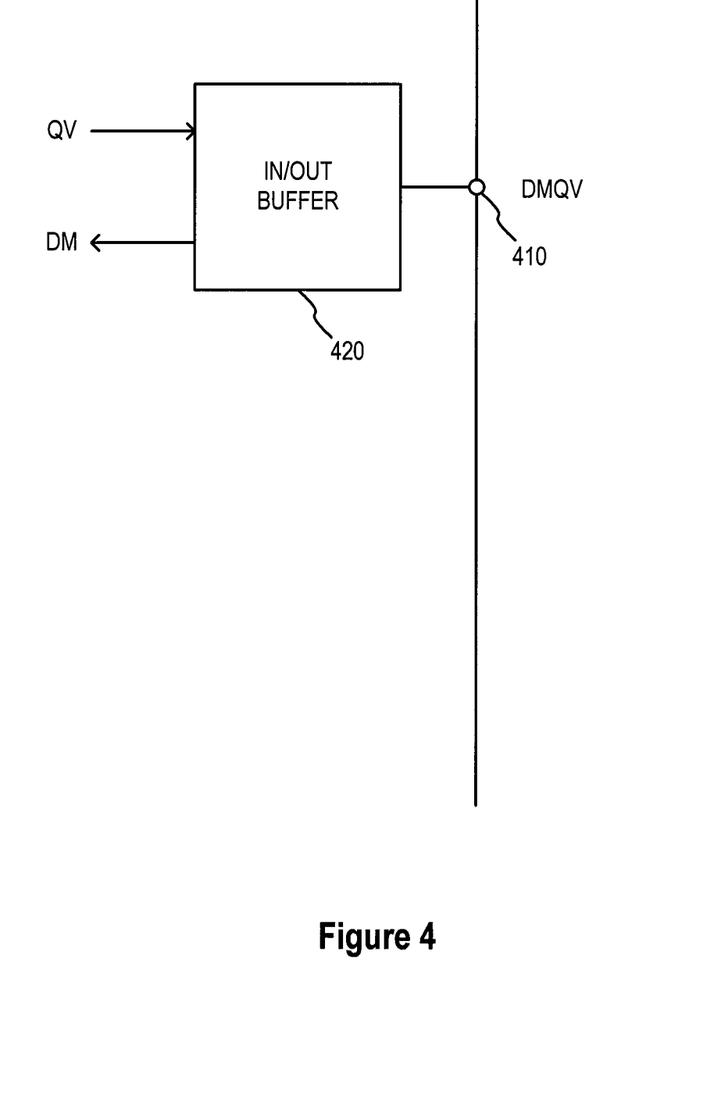
FIG. 4 is a block diagram of a portion of input and output signal nodes for a memory according to an embodiment of the invention.

FIG. 4 illustrates a portion of input and output signal nodes for a memory according to an embodiment of the invention. In contrast to the previously described embodiments that included at least one data strobe signal combined with a non-data signal, FIG. 4 illustrates an embodiment in which two non-data signals are combined to be provided from and receive by the memory at a signal node 410. In the particular embodiment of FIG. 4, an input/output buffer 420 is coupled to receive a data mask signal DM at the signal node 410 and provide an internal DM signal responsive thereto. The input/output buffer 420 further receives and buffers an internal output data valid signal QV to be provided from the signal node 410. In other embodiments, other non-data signals may be combined at a signal node, such as signal node 410. Although not specifically described herein, operation of the embodiment illustrated in FIG. 4 would be understood by those ordinarily skilled in the art based on the description previously provided.

Figure 5:
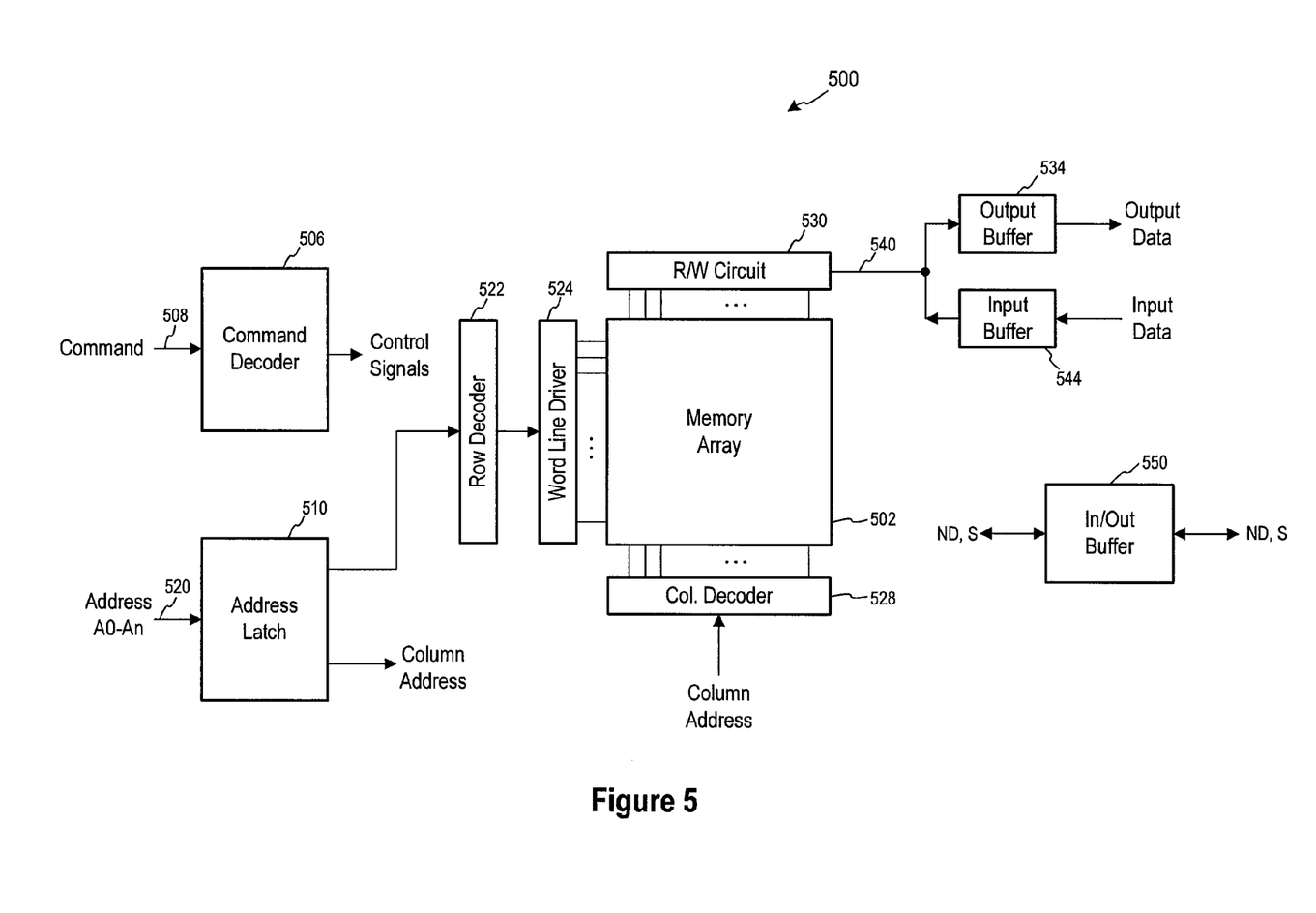
FIG. 5 is a block diagram of a memory system according to an embodiment of the invention including a portion of input and output signals nodes according to an embodiment of the invention.

FIG. 5 illustrates a portion of a memory 500 according to an embodiment of the present invention. The memory 500 includes an array 502 of memory cells, which may be, for example, DRAM memory cells, SRAM memory cells, flash memory cells, or some other types of memory cells. The memory system 500 includes a command decoder 506 that receives memory commands through a command bus 508 and generates corresponding control signals within the memory system 500 to carry out various memory operations. The command decoder 506 responds to memory commands applied to the command bus 508 to perform various operations on the memory array 502. For example, the command decoder 506 is used to generate internal control signals to read data from and write data to the memory array 502. Row and column address signals are applied to the memory system 500 through an address bus 520 and provided to an address latch 510. The address latch then outputs a separate column address and a separate row address.

The row and column addresses are provided by the address latch 510 to a row address decoder 522 and a column address decoder 528, respectively. The column address decoder 528 selects bit lines extending through the array 502 corresponding to respective column addresses. The row address decoder 522 is connected to word line driver 524 that activates respective rows of memory cells in the array 502 corresponding to received row addresses. The selected data line (e.g., a bit line or bit lines) corresponding to a received column address are coupled to a read/write circuitry 530 to provide read data to a data output buffer 534 via an input-output data bus 540. Write data are applied to the memory array 502 through a data input buffer 544 and the memory array read/write circuitry 530.

An input/output buffer 550 is configured to receive internal signals, and buffer and provide the same externally. The input/output buffer 550 is further configured to receive a signal, and buffer and provide an internal signal responsive thereto according to an embodiment of the invention. Examples of such signals include data strobe signals S and non-data signals ND. For example, in some embodiments the input/output buffer 550 receives an internal read data strobe signal and provides the same externally, and the input/output buffer 550 further receives an externally provided data mask signal and provides an internal data mask signal for use with write data. In other embodiments, other types of signals may be handled by the input/output buffer 550 as well.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory, comprising:
   a first signal node;
   a second signal node;
   a first signal buffer coupled to the first signal node and configured to be operative responsive to a first read data strobe signal associated with read data provided by the memory and further configured to be operative responsive to a first non-data signal, wherein the first signal buffer is configured to provide the first read data strobe signal to the first signal node when the first non-data signal is not received by the first signal buffer from the first signal node, and wherein the first signal buffer is configured to receive the first non-data signal from the first signal node when the first read data strobe signal is not provided by the first signal buffer to the first signal node; and
   a second signal buffer coupled to the second signal node and configured to be operative responsive to a second read data strobe signal associated with the read data provided by the memory and further configured to be operative resonsive to a second non-data signal, the second non-data signal not a mask signal, wherein the second signal buffer is configured to provide second data strobe signal to the second signal node when the second non-data signal is not received by the second signal buffer from the second signal node, and wherein the second signal buffer is configured to receive the second non-data signal from the second signal node when the second read data strobe signal is not provided by the second signal buffer to the second signal node.

2. The memory of claim 1 wherein the first non-data signal does not have a preamble portion.

3. The memory of claim 1 wherein the first non-data signal received by the memory is a data mask signal.

4. The memory of claim 1 wherein the read data strobe comprises:
   a strobe portion having clock edges coincident with the read data;
   a preamble portion preceding the strobe portion of the read data strobe; and
   a postamble portion following the strobe portion of the read data strobe.

5. The memory of claim 4 wherein the preamble portion comprises a low logic level during a clock cycle preceding the strobe portion.

6. A memory, comprising:
   a signal node;
   an input/output buffer coupled to the signal node, the input/output buffer configured to receive a data mask signal from the signal node and provide an internal data mask signal responsive to the same and further configured to receive an internal output data valid signal and provide the same to the signal node responsive thereto and during a time other than during receipt of the data mask signal.

7. The memory of claim 6 wherein the internal output data valid signal does not have either a preamble or a postamble.

8. A memory, comprising:
   a first signal node;
   a first input/output signal buffer coupled to the first signal node and configured to buffer a write data strobe signal provided to the first signal node and further configured to buffer a first non-data signal and provide, the same to the first signal node, the write data strobe signal associated with write data received by the memory;
   a second signal node; and
   a second input/output signal buffer coupled to the second signal node and configured to buffer an internal read data strobe signal and provide the same to the second signal node, the read data strobe associated with read data provided by the memory, the input/output signal buffer further configured to buffer a second non-data signal received by the memory at the second signal node.

9. The memory of claim 8 wherein the write data strobe signal includes a preamble portion, a strobe portion, and a post amble portion.

10. The memory of claim 9 wherein the preamble portion comprises a signal transition during a clock cycle preceding a first bit of write data provided to the memory.

11. The memory o claim 8 wherein the read data strobe signal comprises one of a pair of complementary read data strobe signals.

12. A memory comprising:
a first signal node;
a write data strobe buffer coupled to the first signal node and configured to buffer a first write data strobe signal applied to the first signal node, the first write data strobe signal associated with write data rovided to the memgory;
a second signal node;
a first input/output signal buffer coupled to the second signal node and configured to buffer a second write data strobe signal applied to the second signal node, the second write data strobe signal associated with the write data provided to the memory, the first input/output signal buffer further configured to buffer an internal non-data signal and provide the same to the second signal node; and
third signal node: and
a second input/output signal buffer coupled to the third signal node and configured to buffer an internal read data strobe signal and provide the same to the third node, the second input/output signal buffer further configured to buffer an external non-data signal receive by the memory at the third signal node.

13. The memory of claim 12 wherein the internal read data strobe signal includes a preamble portion, a strobe portion, and a post amble portion.

14. The memory of claim 13 wherein the preamble portion comprises a low logic signal during at least a portion of a clock cycle preceding a first bit of read data provided by the memory.

15. The memory of claim 12 wherein the first and second write data strobe signals comprises a pair of complementary write data strobe signals.

16. A method for providing a read data strobe signal from a memory and receiving at the memory a write data strobe signal, comprising:
providing the read data strobe signal from a first signal node during the output of read data;
receiving the write data strobe signal at a second signal node during receipt of write data; and
providing a non-data signal from the second signal node at a time other than during receipt of write data.

17. The method of claim 16 wherein the non-data signal is a first non-data signal and further comprises receiving a second non-data signal at the first signal node during a time other than the output of read data.

18. The method of claim 16 wherein the read data strobe includes a postamble portion and the write data strobe includes a preamble and wherein receiving the write data strobe signal comprises receiving the preamble of the write data strobe signal during a clock cycle immediately following a postamble of the read data strobe signal.

19. The method of claim 16 wherein at least one of the read data or write data strobe signals comprises one of a pair of complementary data strobe signals.

* * * * *

UNITED STATES PATENT AND TRADEMARK OFFICE
CERTIFICATE OF CORRECTION

PATENT NO. : 8,526,247 B2
APPLICATION NO. : 12/874938
DATED : September 3, 2013
INVENTOR(S) : Brian Huber It is certified that error appears in the above-identified patent and that said Letters Patent is hereby corrected as shown below:

On the Title Page, Item (73), under "Assignee", column 1, line 1, delete "Mircon" and insert -- Micron --, therefor.

In the Claims

In column 6, line 15, in Claim 1, delete "resonsive" and insert -- responsive --, therefor.

In column 6, line 17, in Claim 1, after "provide" insert -- the --.

In column 6, line 57, in Claim 8, delete "provide," and insert -- provide --, therefor.

In column 7, line 3, in Claim 9, delete "post amble" and insert -- postamble --, therefor.

In column 7, line 7, in Claim 11, delete "o" and insert -- of --, therefor.

In column 7, line 16, in Claim 12, delete "rovided" and insert -- provided --, therefor.

In column 7, line 17, in Claim 12, delete "memgory;" and insert -- memory; --, therefor.

In column 7, line 27, in Claim 12, delete "node:" and insert -- node; --, therefor.

In column 7, line 32, in Claim 12, delete "receive" and insert -- received --, therefor.

In column 8, line 3, in Claim 13, delete "post amble" and insert -- postamble --, therefor.

In column 8, line 9, in Claim 15, delete "comprises" and insert -- comprise --, therefor.

Signed and Sealed this
Twenty-second Day of April, 2014

Michelle K. Lee
*Deputy Director of the United States Patent and Trademark Office*